US009048856B2

(12) United States Patent
Hollis

(10) Patent No.: US 9,048,856 B2
(45) Date of Patent: *Jun. 2, 2015

(54) DATA BUS INVERSION APPARATUS, SYSTEMS, AND METHODS

(71) Applicant: Micron Technology, Inc., Boise, ID (US)

(72) Inventor: Timothy M. Hollis, Poway, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,127

(22) Filed: Jun. 30, 2014

(65) Prior Publication Data

US 2014/0313062 A1 Oct. 23, 2014

Related U.S. Application Data

(63) Continuation of application No. 13/292,276, filed on Nov. 9, 2011, now Pat. No. 8,766,828, which is a continuation of application No. 12/577,276, filed on Oct. 12, 2009, now Pat. No. 8,094,045, which is a continuation of application No. 12/015,311, filed on Jan. 16, 2008, now Pat. No. 7,616,133.

(51) Int. Cl.
| H03M 5/00 | (2006.01) |
| G06F 13/42 | (2006.01) |
| G11C 7/02 | (2006.01) |
| G11C 7/10 | (2006.01) |

(52) U.S. Cl.
CPC .............. *H03M 5/00* (2013.01); *G06F 13/4234* (2013.01); *G11C 7/02* (2013.01); *G11C 7/1006* (2013.01)

(58) Field of Classification Search
CPC ................. G06F 11/0793; G06F 11/01016
USPC ......... 341/58; 710/124, 7, 305, 313; 711/100, 711/167; 714/48, 768
See application file for complete search history.

(56) References Cited

U.S. PATENT DOCUMENTS

| 6,584,526 | B1 | 6/2003 | Bogin et al. |
| 6,823,303 | B1 | 11/2004 | Su et al. |
| 7,221,292 | B2 | 5/2007 | Hein |
| 7,248,191 | B2 | 7/2007 | Tanaka et al. |
| 7,280,412 | B2 | 10/2007 | Jang et al. |
| 7,522,073 | B1 | 4/2009 | Kao et al. |

(Continued)

FOREIGN PATENT DOCUMENTS

| CN | 101079317 A | 11/2007 |
| CN | 101911034 B | 11/2013 |

(Continued)

OTHER PUBLICATIONS

"Chinese Application Serial No. 200980102231.0, First Office Action mailed Dec. 13, 2011", w/English translation, 32 pgs.

(Continued)

*Primary Examiner* — Joseph Lauture
(74) *Attorney, Agent, or Firm* — Schwegman Lundberg & Woessner, P.A.

(57) ABSTRACT

Apparatus, systems, and methods are disclosed such as those that operate to encode data bits transmitted on a plurality of channels according to at least one of multiple Data Bus Inversion (DBI) algorithms. Additional apparatus, systems, and methods are disclosed.

20 Claims, 6 Drawing Sheets

(56) References Cited

U.S. PATENT DOCUMENTS

| | | | |
|---|---|---|---|
| 7,616,133 | B2 | 11/2009 | Hollis |
| 8,094,045 | B2 * | 1/2012 | Hollis .......................... 341/58 |
| 8,766,828 | B2 | 7/2014 | Hollis |
| 2002/0038396 | A1 | 3/2002 | Kanzaki et al. |
| 2003/0041223 | A1 | 2/2003 | Yeh et al. |
| 2004/0068594 | A1 | 4/2004 | Asaro et al. |
| 2005/0216630 | A1 | 9/2005 | Gaskins et al. |
| 2005/0289435 | A1 | 12/2005 | Mulla et al. |
| 2007/0115733 | A1 | 5/2007 | Jang et al. |
| 2007/0242508 | A1 | 10/2007 | Bae |
| 2008/0082900 | A1 | 4/2008 | Yoon et al. |
| 2009/0141564 | A1 | 6/2009 | Pax |
| 2012/0056762 | A1 | 3/2012 | Hollis |

FOREIGN PATENT DOCUMENTS

| | | | |
|---|---|---|---|
| KR | 20100105685 | A | 9/2010 |
| KR | 101125975 | | 3/2012 |
| TW | 200939241 | A | 9/2009 |
| TW | 201042655 | A | 12/2010 |
| WO | WO-2004052015 | A1 | 6/2004 |

OTHER PUBLICATIONS

"Chinese Application Serial No. 200980102231.0, Office Action mailed Jan. 11, 2013", w/English translation, 6 pgs.

"Chinese Application Serial No. 200980102231.0, Office Action mailed Jul. 13, 2012", w/English translation, 17 pgs.

"Chinese Application Serial No. 200980102231.0, Response filed Mar. 26, 2013 to Office Action mailed Jan. 11, 2013", 19 pgs.

"Chinese Application Serial No. 200980102231.0, Response filed Sep. 19, 2012 to Office Action mailed Jul. 13, 2012", w/English translation, 21 pgs.

"European Application Serial No. 09702742.9, Office Action mailed Sep. 17, 2010", 2 pgs.

"European Application Serial No. 09702742.9, Response filed Oct. 14, 2010 to Office Action mailed Sep. 17, 2010", 18 pgs.

"International Application Serial No. PCT/US2009/000271, International Preliminary Report on Patentability mailed Jul. 20, 2010", 4 pgs.

"International Application Serial No. PCT/US2009/000271, International Search Report mailed Jul. 2, 2009", 3 pgs.

"International Application Serial No. PCT/US2009/000271, Written Opinion mailed Jul. 2, 2009", 3 pgs.

"Lost Circuits", [online]. (c) 1995-2005, LostCircuits. [retrieved Oct. 30, 2006]. Retrieved from the Internet: <URL: http://www.lostcircuits.com/motherboard/p4x/3.shtml>, 4 pgs.

"Taiwan Application Serial No. 098101701, Office Action mailed Jan. 6, 2011", English translation, 4 pgs.

"Taiwan Application Serial No. 098101701, Office Action mailed Jun. 1, 2010", English Translation, 7 pgs.

"Taiwan Application Serial No. 098101701, Response filed Mar. 9, 2011 to Office Action mailed Jan. 6, 2011", w/English translation, 14 pgs.

"Taiwan Application Serial No. 098101701, Response filed Aug. 11, 2010 to Office Action mailed Jun. 1, 2010", English translation, 8 pgs.

Ihm, Jeong-Don, et al., "An 80 nm 4Gb/s/pin 32b 512Mb GDDR4 Graphics DRAM with Low-Power and Low-Noise Data-Bus Inversion", Samsung Electronics, This paper appears in: Solid-State Circuits Conference, 2007ISSCC 2007. Digest of Technical Papers. IEEE International on pp. 492-617 ISSN: 0193-6530, (Feb. 11-15, 2007), 3 pgs.

Sainarayanan, K. S., et al., "Minimizing Simultaneous Switching Noise (SSN) Using Modified Odd/Even Bus Invert Method", Proceedings of the Third IEEE International Workshop on Electronic Design, Test and Applications (DELTA '06), (2005), 4 pgs.

* cited by examiner

DATA BUS INVERSION APPARATUS, SYSTEMS, AND METHODS

PRIORITY APPLICATIONS

This application is a continuation of U.S. application Ser. No. 13/292,276, filed Nov. 9, 2011, which is a continuation of U.S. Ser. No. 12/577,276, filed Oct. 12, 2009, now issued as U.S. Pat. No. 8,094,045, which is a continuation of U.S. application Ser. No. 12/015,311, filed Jan. 16, 2008, now issued as U.S. Pat. No. 7,616,133, all of which are incorporated herein by reference in their entirety.

BACKGROUND

Data transmission between integrated circuit devices may take the form of high-speed data signals, also called data bits, driven over parallel channels in a data bus. The data bits are subject to inter-symbol interference (ISI), crosstalk, and simultaneous switching noise (SSN) that often alter the amplitude and timing of the data bits. The data bits may be encoded to reduce the effects of ISI, crosstalk, and SSN using various techniques of data encoding. One specific form of data encoding is Data Bus Inversion (DBI).

DETAILED DESCRIPTION

Figure 1:
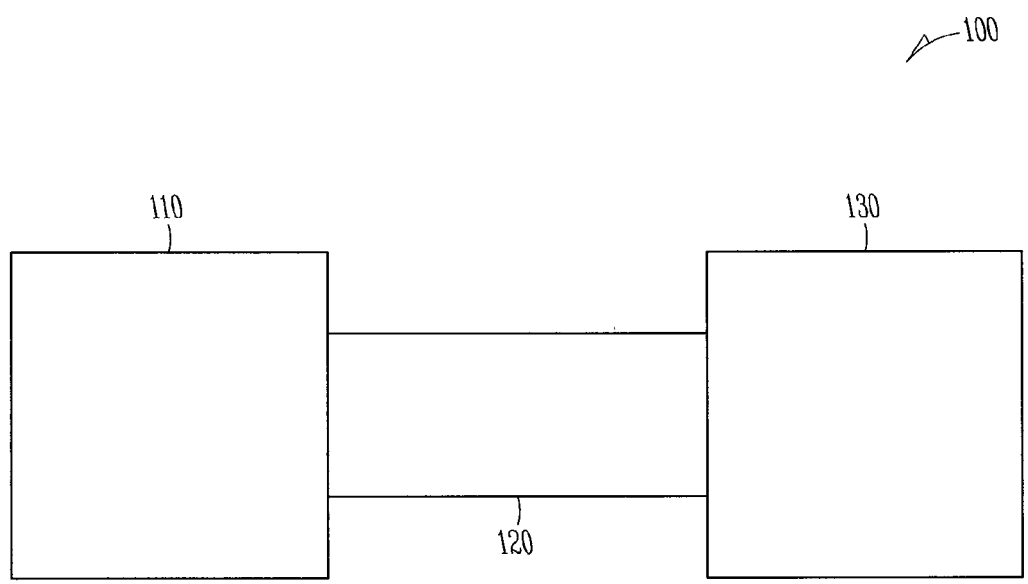
FIG. 1 is a block diagram of a system with data transmission according to an embodiment of the invention.

The inventor has discovered that encoding data bits transmitted on a plurality of channels according to at least one of multiple Data Bus Inversion (DBI) algorithms, according to embodiments of the invention shown and described herein, improves signal quality and power consumption. Encoding transmitted data bits according to only a minimum transitions algorithm is not believed to produce the best results because the data bits are serialized in packets as they come out of a memory array with no correlation from one packet to the next. A first set of parallel bits in each packet does not benefit from encoding according to the minimum transitions algorithm because information about the preceding packet is lost. In addition, the minimum transitions algorithm does not account for the binary state of the data bits; thus, if the majority of the data bits start in a state with a high power dissipation, the minimum transitions algorithm will tend to keep the data bits in this state to avoid transitions.

Inter-symbol interference (ISI), crosstalk, and simultaneous switching noise (SSN) are reduced and power consumption is improved, according to embodiments of the invention shown and described herein, by encoding data bits transmitted on parallel channels in a first cycle according to a first DBI algorithm and encoding data bits transmitted on the parallel channels in a second cycle according to a second DBI algorithm.

DBI is a technique of data encoding that first looks at a relationship between data bits to be transmitted across a data bus and decides, according to an algorithm, if it would be advantageous to invert the data bits prior to transmission. An additional signal transmitted on a separate parallel channel, referred to as a DBI bit, is set when the bits are inverted. The DBI bit identifies to receiver circuits which sets of transmitted data bits have been inverted. The receiver circuits then use the DBI bit to return the incoming data bits to their original state. The data bits may or may not be inverted according to the DBI algorithms.

One DBI algorithm is referred to as a "minimum transitions" algorithm. In general, the minimum transitions algorithm begins by computing how many data bits transmitted across a parallel data bus will result in a transition during the upcoming cycle. When more than a number of transitions are predicted, the minimum transitions algorithm inverts the data bits to be transmitted over the parallel data bus, sets the DBI bit to a first specified state (high or low depending on the implementation), and drives the encoded data bits and the DBI bit across transmission channels in the parallel data bus. When more than the number of transitions are not predicted, the minimum transitions algorithm does not invert the data bits to be transmitted over the parallel data bus, sets the DBI bit to a second specified state (high or low depending on the implementation), and drives the encoded data bits and the DBI bit across transmission channels in the parallel data bus. The DBI bit is used to restore the original data bits prior to use in a receiving system. Variations of the minimum transitions algorithm may be used in some embodiments. The number of transitions may be predetermined.

A second DBI algorithm is referred to as a "minimum zeros" algorithm. The minimum zeros algorithm reduces the number of binary zeros in data bits transmitted across a parallel data bus. The minimum zeros algorithm inverts the data bits if more than a number of the data bits are binary zeros. The data bits are not inverted if less than the number of the data bits are binary zeros. The number can be, for example, half of the total number of data bits. Thus, according to the algorithm, whether the data bits are or are not inverted, the DBI bit is set to a corresponding state (high or low depending on the implementation), and the encoded data bits and the DBI bit are driven across transmission channels in the parallel data bus. The DBI bit is used to restore the original data bits prior to use in a receiving system. The number may be predetermined.

A variation of the minimum zeros algorithm is referred to as the "minimum ones" algorithm. The minimum ones algorithm reduces the number of binary ones in data bits transmitted across a parallel data bus. The minimum ones algorithm inverts the data bits if more than a number of the data bits are binary ones. The data bits are not inverted if less than the number of the data bits are binary ones. The number can be, for example, half of the total number of data bits. Thus, according to the algorithm, whether the data bits are or are not inverted, the DBI bit is set to a corresponding state (high or low depending on the implementation), and the encoded data bits and the DBI bit are driven across transmission channels in the parallel data bus. The DBI bit is used to restore the original data bits prior to use in a receiving system. The number may be predetermined.

FIG. 1 is a block diagram of a system 100, with data transmission according to an embodiment of the invention. A first integrated circuit device 110 may generate and transmit data bits over a parallel data bus 120 to a second integrated circuit device 130. The data bus 120 may be a unidirectional bus or a bidirectional bus, in which case the second integrated circuit device 130 may generate and transmit data bits over the data bus 120 to the first integrated circuit device 110. The data bus 120 includes approximately parallel conductive traces or lines that may be called channels, and these channels are coupled at each end to respective pins in the devices 110 and 130. The data bits are binary data bits including ones and zeros. A one can be transmitted by a high voltage signal over a finite period of time, and a zero can be transmitted by a low voltage signal over a finite period of time. In some embodiments, the voltage levels representing ones and zeros are reversed. The data bus 120 can include any number of channels, from two to as many as will physically fit between the devices 110 and 130. The data bus 120 may include 4, 8, 16, 32, 64, or 72 channels, and the data bus 120 can include additional channels to transmit control signals in parallel with the data bits. For example, the data bus 120 may have 72 data channels and 8 control channels for a total of 80 channels. The data bus 120 may be logically divided into byte-wide lanes and unrelated data may be transmitted over neighboring lanes.

Figure 2:
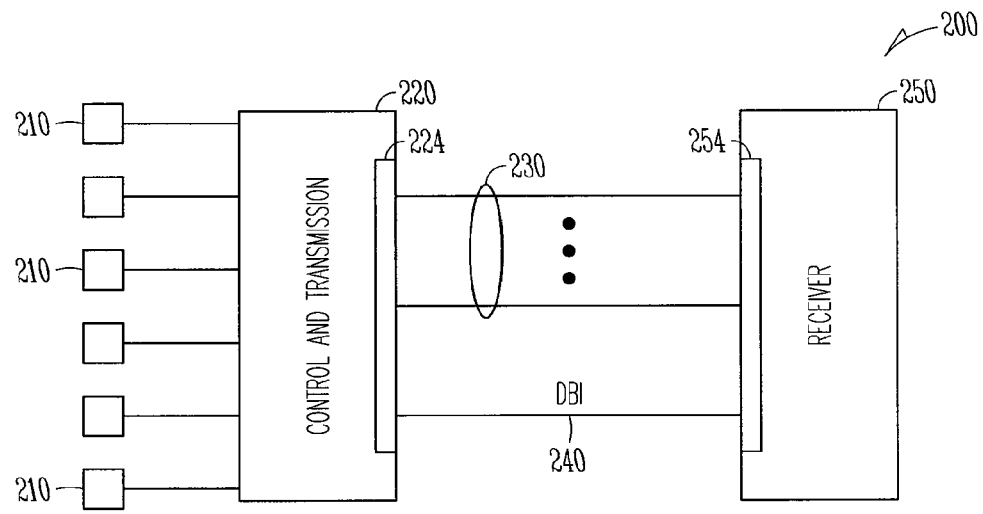
FIG. 2 is a block diagram of a system with data transmission according to an embodiment of the invention.

FIG. 2 is a block diagram of a system 200 with data transmission according to an embodiment of the invention. A memory bank includes a dynamic random access memory (DRAM) device array including a plurality of DRAM devices 210 containing data bits to be transmitted on a bus. A control and transmission circuit 220 is coupled to receive data bits from the DRAM devices 210. The control and transmission circuit 220 includes a DBI circuit 224. The DBI circuit 224 is coupled to a data bus including a plurality of channels 230 and a DBI channel 240, which is to carry a DBI bit as is described herein below. The channels 230 and the DBI channel 240 are coupled to deliver data bits to a receiver device 250, and in particular to a receiver circuit 254 in the receiver device 250. The receiver device 250 restores data bits that were inverted by the control and transmission circuit 220 using the DBI bit from the DBI channel 240. The channels 230 may include any number of channels such as, for example, 4, 8, or 16 channels, or any other number of channels for which the DBI channel 240 sufficiently reduces ISI, crosstalk, and SSN. There may be more channels including DBI channels coupled between the control and transmission circuit 220 and the receiver device 250. The DRAM devices 210, the control and transmission circuit 220, and the receiver device 250 are integrated circuits. The DBI circuit 224 and the receiver circuit 254 and associated operation will be further described herein below.

The channels 230 and the DBI channel 240 may also deliver data bits from the receiver device 250 to the control and transmission circuit 220 and the DRAM devices 210 in a bidirectional manner according to embodiments of the invention. Alternatively, a separate set of unidirectional channels (not shown) may deliver data bits from the receiver device 250 to the control and transmission circuit 220 and the DRAM devices 210 according to embodiments of the invention.

Figure 3:
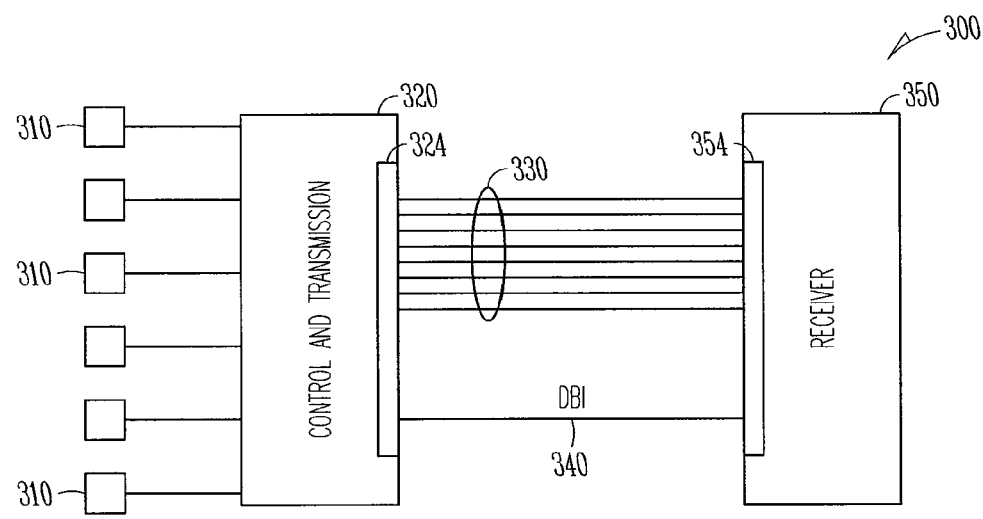
FIG. 3 is a block diagram of a system with data transmission according to an embodiment of the invention.

FIG. 3 is a block diagram of a system 300 with data transmission according to an embodiment of the invention. A memory bank includes a plurality of DRAM devices 310 containing data bits to be transmitted on a data bus. A control and transmission circuit 320 is coupled to receive data bits from the DRAM devices 310. The control and transmission circuit 320 includes a DBI circuit 324. The DBI circuit 324 is coupled to a data bus including eight channels 330 and a DBI channel 340, which is to carry a DBI bit. The system 300 is similar to the system 200 shown in FIG. 2 and is more specific in that there are eight channels 330 identified respectively as D0-D7. The channels 330 and the DBI channel 340 are coupled to deliver data bits to a receiver device 350, and in particular to a receiver circuit 354 in the receiver device 350. The receiver device 350 restores data bits that were inverted by the control and transmission circuit 320 using the DBI bit from the DBI channel 340. There may be more channels including DBI channels coupled between the control and transmission circuit 320 and the receiver device 350. The DRAM devices 310, the control and transmission circuit 320, and the receiver device 350 are integrated circuits. The DBI circuit 324 and the receiver circuit 354 and associated operation will be further described herein below.

The channels 330 and the DBI channel 340 may also deliver data bits from the receiver device 350 to the control and transmission circuit 320 and the DRAM devices 310 in a bidirectional manner according to embodiments of the invention. Alternatively, a separate set of unidirectional channels (not shown) may deliver data bits from the receiver device 350 to the control and transmission circuit 320 and the DRAM devices 310 according to embodiments of the invention.

In some embodiments, the memory bank in the system 200 of FIG. 2 or the system 300 of FIG. 3 includes more or less DRAM devices 210 or 310 than are shown. In some embodiments, the memory bank includes only a single DRAM device. In some embodiments, the memory bank may include one or more static random access memory (SRAM) devices or Flash memory devices or other types of memory devices. In some embodiments, the memory bank includes only SRAM devices or only Flash memory devices or various combinations of DRAM devices, SRAM devices, Flash memory devices, and other memory devices.

Figure 4:
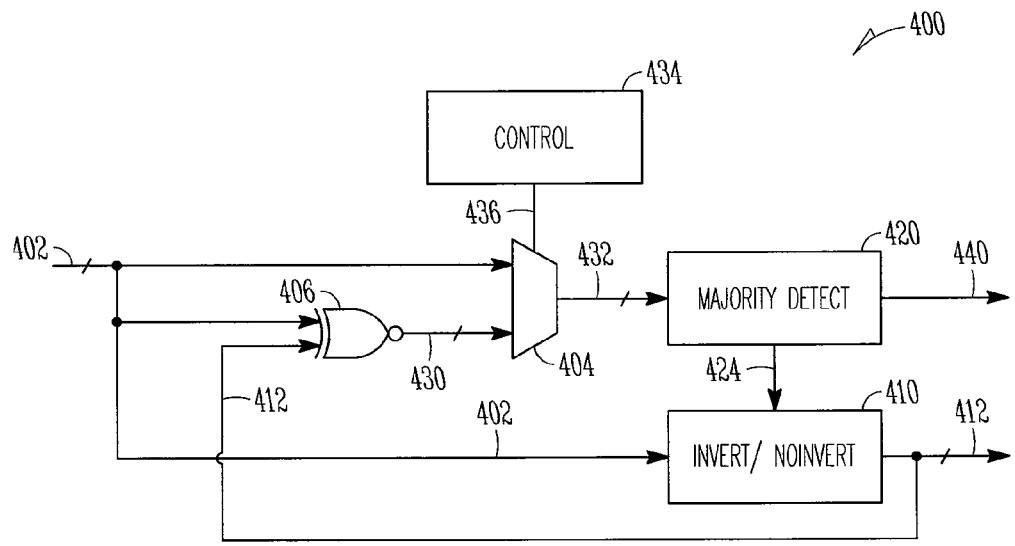
FIG. 4 is a block diagram of a data bus inversion (DBI) circuit according to an embodiment of the invention.

FIG. 4 is a block diagram of a DBI circuit 400 according to an embodiment of the invention. The DBI circuit 400 selects a DBI algorithm and then encodes original data bits according to the selected DBI algorithm. The resulting encoded data bits are generated on a group of lines. The DBI circuit 400 is shown as the DBI circuit 224 in the control and transmission circuit 220 shown in FIG. 2 or the DBI circuit 324 in the control and transmission circuit 320 shown in FIG. 3.

A block of original data bits is received on a group of lines 402 that are coupled to a first input of a multiplexer 404, a first input of an exclusive-OR (XOR) logic gate 406, and an inversion circuit 410. The inversion circuit 410 receives the original data bits from the lines 402 and generates encoded data bits on a group of lines 412. The encoded data bits on the lines 412 are the same as the original data bits on the lines 402 unless the original data bits are inverted by the inversion circuit 410. A majority detect circuit 420 generates a signal on a line 424 coupled to the inversion circuit 410 to indicate whether the original data bits on the lines 402 are to be inverted. A block of data bits may also be referred to as a set of data bits, a subset of the set of data bits, or a group of data bits.

A second input of the XOR logic gate 406 is coupled to receive the encoded data bits on the lines 412. The XOR logic gate 406 is configured to compare the original data bits on the lines 402 with the encoded data bits on the lines 412 and to generate XOR data bits on a group of lines 430. If the original data bits and the encoded data bits are different on corresponding individual lines 402 and 412, the XOR logic gate 406 generates a binary one on a respective one of the lines 430. If the original data bits and the encoded data bits are the same on corresponding individual lines 402 and 412, the XOR logic gate 406 generates a binary zero on a respective one of the lines 430.

The lines 430 are coupled to a second input of the multiplexer 404, and the multiplexer 404 couples either the original data bits from the lines 402 or the XOR data bits from the lines 430 to a group of lines 432 and the majority detect circuit 420 in response to a control signal coupled from a control circuit 434 on a line 436. The control circuit 434 decides whether the DBI circuit 400 is to implement the minimum transitions algorithm, the minimum zeroes algorithm, or the minimum ones algorithm with the control signal on the line 436. The minimum transitions algorithm is implemented if the XOR data bits on the lines 430 are coupled to the majority detect circuit 420. The minimum zeroes algorithm or the minimum ones algorithm is implemented if the original data bits on the lines 402 are coupled to the majority detect circuit 420.

The majority detect circuit 420 implements the minimum transitions algorithm by determining if the XOR data bits on the lines 430 contain a majority of binary ones indicating that a majority of the output signals on the lines 412 will change state in the next clock cycle. If the XOR data bits on the lines 430 contain a majority of binary ones, the majority detect circuit 420 generates the signal on the line 424 to instruct the inversion circuit 410 to invert the original data bits on the lines 402 to generate the encoded data bits on the lines 412, and generates a high DBI bit on a DBI channel 440 to indicate that the encoded data bits on the lines 412 are inverted. If the XOR data bits on the lines 430 contain a majority of binary zeroes indicating that less than a majority of the output signals on the lines 412 will change state in the next clock cycle, the signal on the line 424 from the majority detect circuit 420 does not instruct the inversion circuit 410 to invert the original data bits on the lines 402, and the encoded data bits generated on the lines 412 in the following clock cycle are the same as the original data bits on the lines 402. In this instance, the majority detect circuit 420 generates a low DBI bit on the DBI channel 440 to indicate that the encoded data bits on the lines 412 are not inverted.

The majority detect circuit 420 implements the minimum zeroes algorithm by determining if the original data bits on the lines 402 contain a majority of binary zeroes or not. If the original data bits on the lines 402 contain a majority of binary zeros, the majority detect circuit 420 generates the signal on the line 424 to instruct the inversion circuit 410 to invert the original data bits on the lines 402 to generate the encoded data bits on the lines 412 in the following clock cycle, and generates a high DBI bit on the DBI channel 440 to indicate that the encoded data bits on the lines 412 are inverted. If the original data bits on the lines 402 contain a majority of binary ones, the signal on the line 424 from the majority detect circuit 420 does not instruct the inversion circuit 410 to invert the original data bits on the lines 402, and the encoded data bits generated on the lines 412 in the following clock cycle are the same as the original data bits on the lines 402. In this instance, the majority detect circuit 420 generates a low DBI bit on the DBI channel 440 to indicate that the encoded data bits on the lines 412 are not inverted.

The majority detect circuit 420 implements the minimum ones algorithm by determining if the original data bits on the lines 402 contain a majority of binary ones or not. If the original data bits on the lines 402 contain a majority of binary ones, the majority detect circuit 420 generates the signal on the line 424 to instruct the inversion circuit 410 to invert the original data bits on the lines 402 to generate the encoded data bits on the lines 412 in the following clock cycle, and generates a high DBI bit on the DBI channel 440 to indicate that the encoded data bits on the lines 412 are inverted. If the original data bits on the lines 402 contain a majority of binary zeroes, the signal on the line 424 from the majority detect circuit 420 does not instruct the inversion circuit 410 to invert the original data bits on the lines 402, and the encoded data bits generated on the lines 412 in the following clock cycle are the same as the original data bits on the lines 402. In this instance, the majority detect circuit 420 generates a low DBI bit on the DBI channel 440 to indicate that the encoded data bits on the lines 412 are not inverted.

The majority detect circuit 420 may be arranged to detect a majority of binary ones to implement the minimum ones algorithm or to detect a majority of binary zeroes to implement the minimum zeroes algorithm. Additional control circuitry (not shown) may be added to enable the majority detect circuit 420 to detect both a majority of binary ones and a majority of binary zeroes to implement both the minimum ones and the minimum zeroes algorithms according to embodiments of the invention. The voltage levels of the DBI bit may be reversed and convey the same information with appropriate logic in a receiver circuit to interpret the DBI bit.

Figure 5:
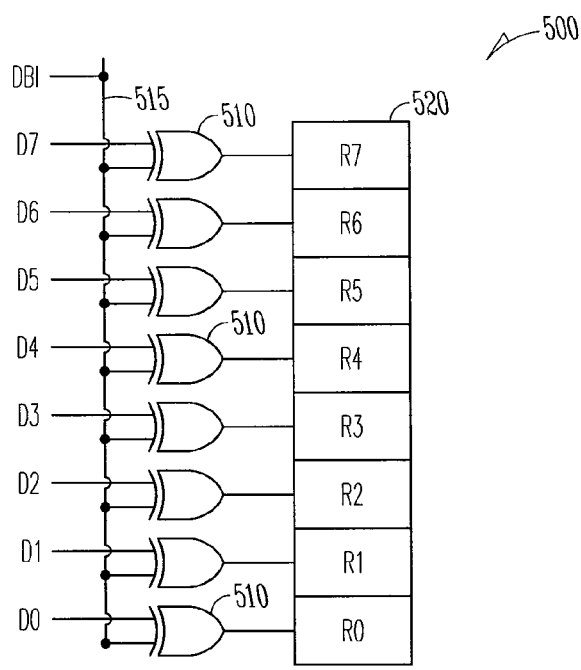
FIG. 5 is a block diagram of a receiver circuit according to an embodiment of the invention.

FIG. 5 is a block diagram of a receiver circuit 500 according to an embodiment of the invention. The receiver circuit 500 is shown as the receiver circuit 254 in the receiver device 250 shown in FIG. 2 or the receiver circuit 354 in the receiver device 350 shown in FIG. 3. The receiver circuit 254 and the receiver circuit 354 have additional elements to receive more channels than are shown in FIG. 5 according to embodiments of the invention. The receiver circuit 500 includes eight XOR logic gates 510, one for each of eight channels D0-D7 in a parallel data bus. Each channel D0-D7 is coupled to one input of a respective XOR logic gate 510, and a second input of each XOR logic gate 510 is coupled to a DBI channel 515 over which a DBI bit is transmitted in parallel with data bits on the channels D0-D7. If the transmitted data bits on the channels D0-D7 were inverted from original data prior to being transmitted, the DBI bit is a binary one, and the data bits on the channels D0-D7 are inverted by the respective XOR logic gates 510 to generate the original data bits on outputs of the XOR logic gates 510. The outputs of the XOR logic gates 510 are coupled to respective locations R0-R7 in a data register 520 to store the original data bits to be used by a receiver device such as the receiver devices 250 and 350. If the transmitted data bits on the channels D0-D7 were not inverted from original data bits prior to being transmitted, the DBI bit is a binary zero, and the data bits on the channels D0-D7 are not changed by the respective XOR logic gates 510 but passed through to the outputs of the XOR logic gates 510 and respective locations R0-R7 in the data register 520 to store the original data bits to be used by the receiver device such as the receiver devices 250 and 350.

Figure 6:
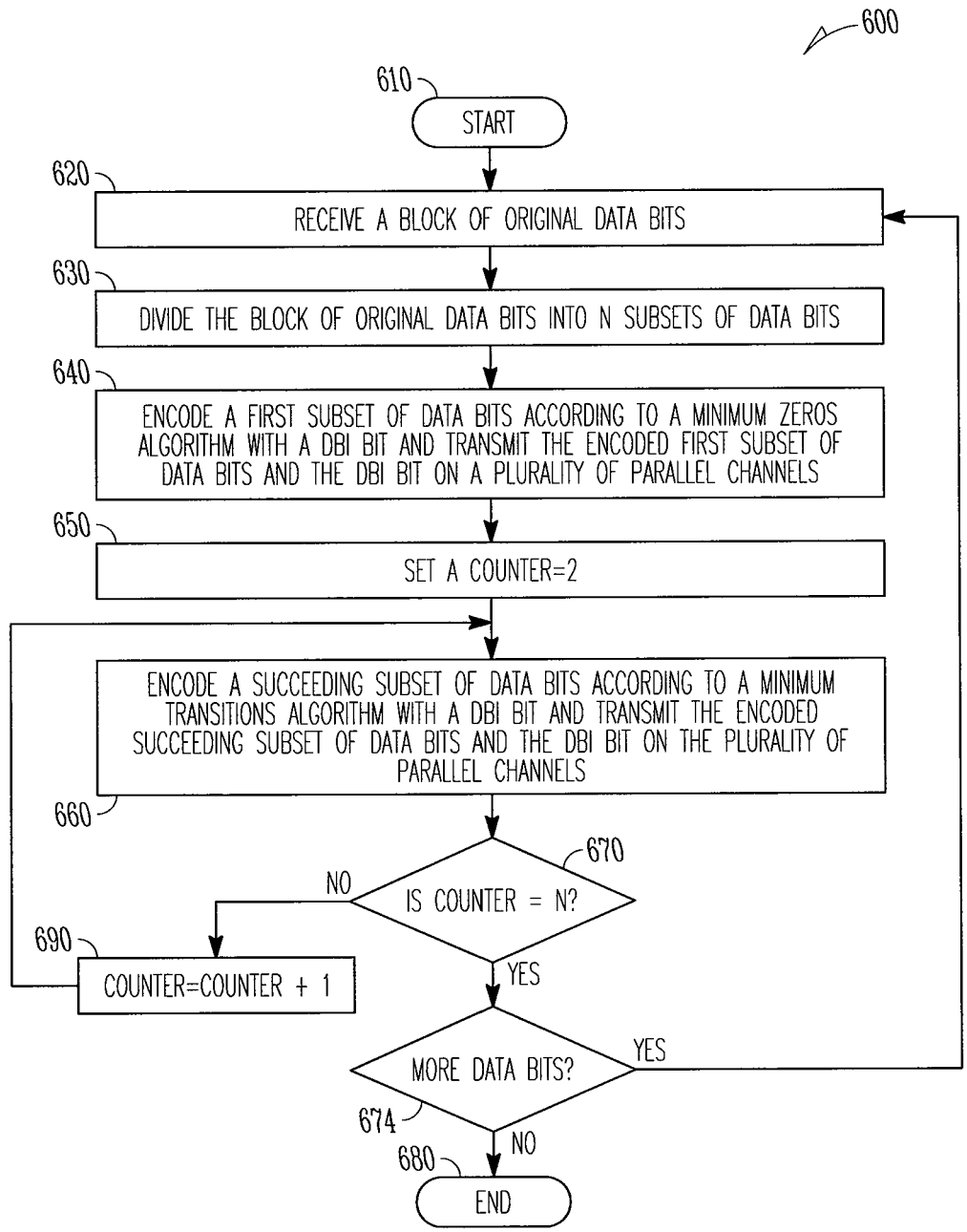
FIG. 6 is a flow diagram of several methods according to embodiments of the invention.

FIG. 6 is a flow diagram of several methods 600 according to embodiments of the invention. The methods 600 start in block 610. In block 620, a block of original data bits is received. In block 630, the block of original data bits is divided into N subsets of the data bits where N is an integer. In block 640, a first subset of the data bits is encoded according to a minimum zeros algorithm with a DBI bit, and the encoded first subset of the data bits and the DBI bit are transmitted on a plurality of parallel channels. In block 650, a counter is set to equal 2. In block 660, a succeeding subset of the data bits is encoded according to a minimum transitions algorithm with a DBI bit, and the encoded succeeding subset of the data bits and the DBI bit are transmitted on the plurality of parallel channels. In block 670, the methods 600 determine if the counter equals the integer N. If the counter equals the integer N in block 670, the methods 600 continue to block 674 where the methods 600 determine if more data bits are to be transmitted. If more data bits are to be transmitted, the methods 600 return to block 620. If no more data bits are to be transmitted, the methods 600 end in block 680. If the counter does not equal the integer N in block 670, the methods 600 continue in block 690 where the integer 1 is added to the counter, and the methods 600 return to block 660 where a succeeding subset of the data bits is encoded according to the minimum transitions algorithm with a DBI bit, and the encoded succeeding subset of the data bits and the DBI bit are transmitted on the plurality of parallel channels.

Figure 7:
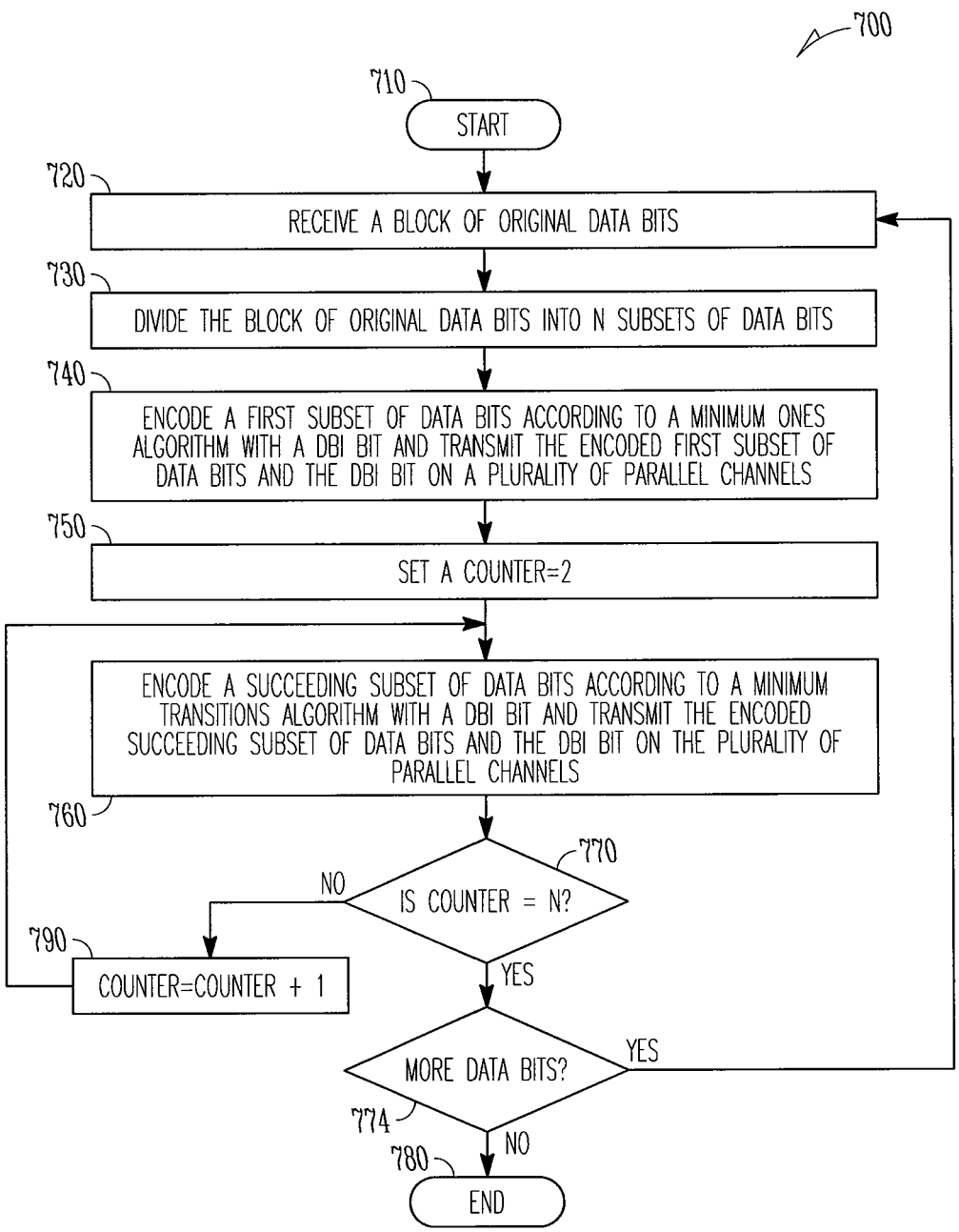
FIG. 7 is a flow diagram of several methods according to embodiments of the invention.

FIG. 7 is a flow diagram of several methods 700 according to embodiments of the invention. The methods 700 start in block 710. In block 720, a block of original data bits is received. In block 730, the block of original data bits is divided into N subsets of the data bits where N is an integer. In block 740, a first subset of the data bits is encoded according to a minimum ones algorithm with a DBI bit, and the encoded first subset of the data bits and the DBI bit are transmitted on a plurality of parallel channels. In block 750, a counter is set to equal 2. In block 760, a succeeding subset of the data bits is encoded according to a minimum transitions algorithm with a DBI bit, and the encoded succeeding subset of the data bits and the DBI bit are transmitted on the plurality of parallel channels. In block 770, the methods 700 determine if the counter equals the integer N. If the counter equals the integer N in block 770, the methods 700 continue to block 774 where the methods 700 determine if more data bits are to be transmitted. If more data bits are to be transmitted, the methods 700 return to block 720. If no more data bits are to be transmitted, the methods 700 end in block 780. If the counter does not equal the integer N in block 770, the methods 700 continue in block 790 where the integer 1 is added to the counter, and the methods 700 return to block 760 where a succeeding subset of the data bits is encoded according to the minimum transitions algorithm with a DBI bit, and the encoded succeeding subset of the data bits and the DBI bit are transmitted on the plurality of parallel channels.

Figure 8:
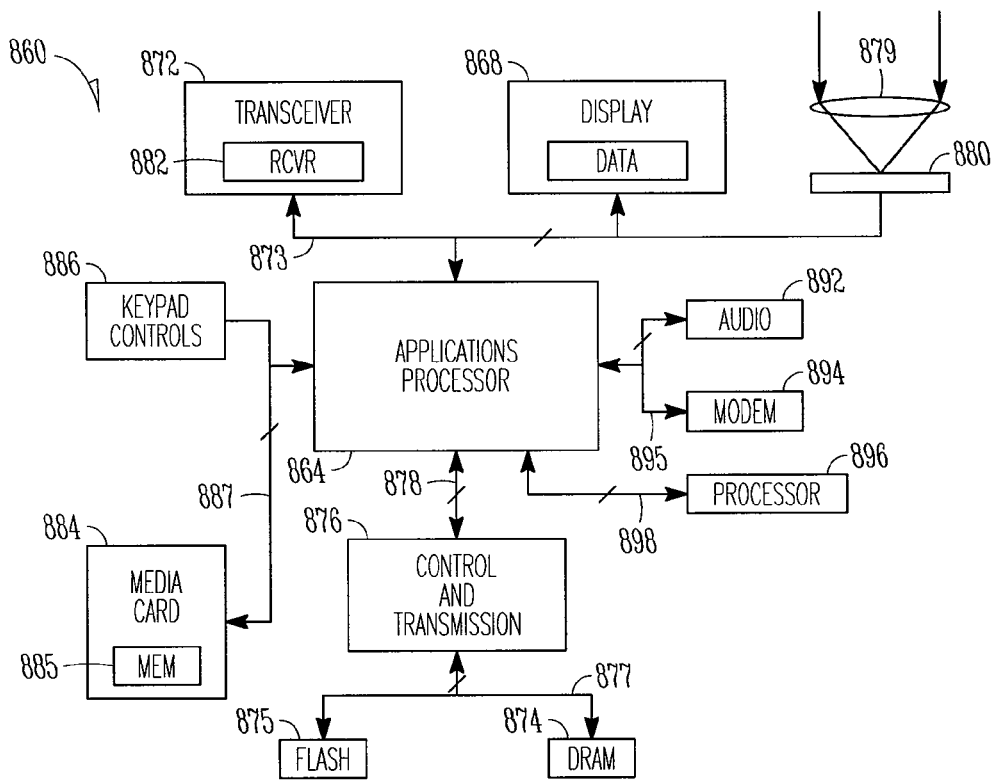
FIG. 8 is a block diagram of a system according to an embodiment of the invention.

FIG. 8 is a block diagram of a system 860 according to an embodiment of the invention. The system 860, in some embodiments, may include a processor 864 coupled to a display 868 and/or a wireless transceiver 872 through a bus 873. The display 868 may be used to display data, perhaps received by the wireless transceiver 872. The system 860, in some embodiments, may include a memory device such as a DRAM device array 874 including a plurality of DRAM devices and/or a Flash memory device array 875 including a plurality of Flash memory devices. The DRAM device array 874 and/or the Flash memory device array 875 are coupled to exchange data bits with a control and transmission circuit 876 over a bus 877 according to embodiments of the invention described herein. The processor 864 is coupled to exchange data bits with the control and transmission circuit 876 over a bus 878 according to embodiments of the invention described herein. The DRAM devices in the DRAM device array 874 may be synchronous DRAM (SDRAM) devices.

The processor 864 performs the functions of the receiver devices 250 or 350 shown respectively in FIG. 2 and FIG. 3 and may include the receiver circuit 500 shown in FIG. 5 according to embodiments of the invention. The control and transmission circuit 876 may include a DBI circuit such as the DBI circuit 400 shown in FIG. 4 according to embodiments of the invention. The control and transmission circuit 876 may be the control and transmission circuit 220 shown in FIG. 2 or the control and transmission circuit 320 shown in FIG. 3 according to embodiments of the invention.

In some embodiments, the system 860 may include a camera including a lens 879 and an imaging plane 880 to couple to the processor 864 through the bus 873. The imaging plane 880 may be used to receive light captured by the lens 879.

Many variations are possible. For example, in some embodiments, the system 860 may include a cellular telephone receiver 882 forming a pinion of the wireless transceiver 872. The cellular telephone receiver 882 may also receive data to be processed by the processor 864 and displayed on the display 868. In some embodiments, the system 860 may include an audio, video, or multi-media player 884, including a memory device 885 and a set of media playback controls 886 to couple to the processor 864 through a bus 887. The processor 864 may also be coupled to exchange data bits with an audio device 892 and/or a modem 894 through a bus 895.

In some embodiments, the processor 864 is coupled to exchange data bits with a second processor 896 over a bus 898. The processor 864 and the second processor 896 may both include circuits and devices such as the circuits and devices shown and described herein to exchange data bits according to embodiments of the invention described herein.

Any of the electronic components of the system 860 may transmit data to other components of the system 860 according to embodiments of the invention described herein.

Any of the circuits or systems described herein may be referred to as a module. A module may comprise a circuit and/or firmware according to embodiments of the invention. Any of the groups of channels described herein may be approximately parallel channels.

The individual activities of methods 600 and 700 may not have to be performed in the order shown or in any particular order. Some activities may be repeated, and others may occur only once. Embodiments of the invention may have one or more or fewer activities than those shown in FIGS. 6 and 7.

Implementation of the embodiments of the invention described herein can reduce ISI, crosstalk, and SSN and improve power consumption by encoding data bits transmitted on parallel channels in a first cycle according to a first DBI algorithm and encoding data bits transmitted on the parallel channels in a second cycle according to a second DBI algorithm. According to one or more embodiments of the invention, a first byte of data bits in a packet is encoded according to the minimum zeros algorithm or the minimum ones algorithm to, for example, reset the data bits at the beginning of each packet to a low power state. Encoding according to the minimum zeros algorithm or the minimum ones algorithm does not require memory of the state of previously transmitted data bits. Data bits following the first byte in a packet are encoded according to the minimum transitions algorithm to, for example, reduce the number of transitions while maintaining lower power operation to reduce ISI, crosstalk, and SSN. Even in an application where the previous state of the transmitted data bits is always known, the embodiments of the invention described herein should provide periodic resetting of a system to the low power state.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of an embodiment of the invention is determined by the appended claims, along with the full range of equivalents to which such claims are entitled.

The Abstract is provided to comply with 37 C.F.R. §1.72(b) requiring an abstract that will allow the reader to quickly ascertain the nature of the technical disclosure. The Abstract is submitted with the understanding that it will not be used to interpret or limit the scope or meaning of the claims.

What is claimed is:

1. A method, comprising:
   receiving a plurality of subsets of original data bits to be transmitted on channels;
   applying a first encoding algorithm, comprising a minimum logic state algorithm, to at least one of the subsets to form at least one first encoded subset;
   applying a second encoding algorithm, comprising a minimum transitions algorithm, to at least one of the subsets to form at least one second encoded subsets; and
   transmitting the at least one first and second encoded subsets on the channels.

2. The method of claim 1, wherein both the first and second encoding algorithms comprise data bus inversion algorithms in which encoding a subset of original data bits comprises inverting the original data bits.

3. The method of claim 2, wherein the first and second encoding algorithms invert only some of the subsets when forming the first and second encoded subsets.

4. The method of claim 1, further comprising transmitting at least one encoding bit on a channel in parallel with each of the transmitted first and second subsets.

5. A method, comprising:
   receiving a plurality of subsets of original data bits to be transmitted on channels;
   applying a first encoding algorithm only to a first subset in a sequence of the plurality of subsets to form at least one first encoded subset;
   applying a second encoding algorithm to subsequent subsets in the sequence of the plurality of subsets to form at least one second encoded subsets; and
   transmitting the at least one first and second encoded subsets on the channels.

6. A method, comprising:
   receiving a plurality of subsets of original data bits to be transmitted on channels;
   applying a first encoding algorithm to at least one of the subsets to form at least one first encoded subset;
   applying a second encoding algorithm to at least one of the subsets to form at least one second encoded subsets; and
   transmitting the at least one first and second encoded subsets on the channels;
   wherein whether the first or second encoding algorithm is applied to a particular subset of original data bits depends on a location of the particular subset in a sequence of the plurality of subsets.

7. An apparatus, comprising:
   inputs for receiving subsets of original data bits to be transmitted on channels;
   an encoder circuit for encoding the subsets with a selected one a plurality of data bus inversion encoding algorithms comprising a minimum transitions algorithm and at least one of a minimum ones and a minimum zeros algorithm, and for coupling the encoded subsets onto to the channels; and
   a control module for selecting which one of the plurality of encoding algorithms should be applied by the encoder circuit.

8. The apparatus of claim 7, wherein the encoder circuit encodes the subsets by either inverting the subsets or not.

9. The apparatus of claim 7, wherein the encoder circuit comprises a multiplexer.

10. The apparatus of claim 7, wherein the encoder circuit includes:
    a first module for deciding whether or not to invert the subsets according to one of the encoding algorithms before coupling the encoded subsets onto to the channels; and
    a second module configured to encode the subsets by inverting or not inverting the original data bits in response to the decision of the first module and to couple the encoded subsets onto to the channels.

11. The apparatus of claim 10, wherein the first module generates an encoding bit indicative of its decision whether or not to invert the subsets, and to transmit the encoding bit on one of the channels.

12. A method comprising:
    receiving, at an encoder, a plurality of subsets of original data bits to be transmitted in a direction on channels;
    applying to some of the subsets at the encoder only a first data bus inversion algorithm; and
    applying to some other of the subsets at the encoder only a second data bus inversion algorithm to form encoded subsets,
    wherein the first and second data bus inversion algorithms are different, wherein the first data bus inversion algorithm comprises a minimum logic state algorithm, and wherein the second data bus inversion algorithm comprises a minimum transitions algorithm.

13. The method of claim 12, further comprising transmitting encoded subsets and a data bus inversion bit on a plurality of parallel channels.

14. The method of claim 13, further comprising outputting an encoding bit onto at least one of the plurality of channels.

15. The method of claim 12, further comprising a multiplexer receiving the original data bits at first inputs in parallel.

16. The method of claim 15, further comprising an inversion circuit outputting data bits onto the plurality of channels in parallel.

17. The method of claim 12, further comprising a control module controlling a multiplexer to pass first inputs of a first cycle of the original data bits and passing second inputs for subsequent cycles of original data bits.

18. The method of claim 17, further comprising comparing the original data bits and previous data bits at the second inputs.

19. The method of claim 18, further comprising transmitting the previous data bits during a cycle immediately prior to a cycle in which output data bits are output onto a plurality of channels by an inversion circuit.

20. The method of claim 18, wherein comparing the original data bits and previous data bits includes exclusive ORing each original data bit with a corresponding previous data bit.

* * * * *